United States Patent [19]
Fodor et al.

[11] Patent Number: 5,531,835
[45] Date of Patent: Jul. 2, 1996

[54] PATTERNED SUSCEPTOR TO REDUCE ELECTROSTATIC FORCE IN A CVD CHAMBER

[75] Inventors: Mark A. Fodor, Los Gatos; Craig A. Bercaw, Sunnyvale; Charles Dornfest, Fremont, all of Calif.

[73] Assignee: Applied Materials, Inc., Santa Clara, Calif.

[21] Appl. No.: 246,015

[22] Filed: May 18, 1994

[51] Int. Cl.⁶ .................................................. C23C 16/00
[52] U.S. Cl. .............................................. 118/728; 118/500
[58] Field of Search ........................................ 118/728, 50

[56] References Cited

U.S. PATENT DOCUMENTS

| | | | |
|---|---|---|---|
| 4,724,510 | 2/1988 | Wicker et al. | 361/234 |
| 4,897,171 | 1/1990 | Ohmi | 204/298 |
| 5,258,047 | 11/1993 | Tokisue et al. | 29/25.01 |
| 5,266,527 | 11/1993 | Robbins | 118/728 |
| 5,403,401 | 4/1995 | Haafkens et al. | 118/728 |

FOREIGN PATENT DOCUMENTS

| | | | |
|---|---|---|---|
| 0452222 | 10/1991 | European Pat. Off. | H01L 21/00 |
| 2473930 | 3/1992 | European Pat. Off. | H01L 21/68 |
| 0537364 | 4/1993 | European Pat. Off. | H01J 21/68 |
| 2554288 | 3/1985 | France | H02N 13/00 |

*Primary Examiner*—R. Bruce Breneman
*Assistant Examiner*—Ramamohan Rao Paladugu
*Attorney, Agent, or Firm*—Janis Biksa

[57] ABSTRACT

A susceptor or other semiconductor wafer processing and/or transfer support platform includes a surface pattern having two or more regions of high and low elevation. The regions of high and low elevations can be rectangular/square dimpled patterns having tops coplanar with one another to support a semiconductor wafer for processing. The high and low regions can also be a wave form appearing to emanate from a point, where each of the wave crests form an imaginary plane on which a wafer to be processed can rest. The combination of high and low regions increases the average spacing between the wafer and the susceptor and reduces or eliminates the capacitive coupling (or sticking force) between processing hardware and a substrate (wafer) created by electrical fields during processing. The dimpled patterns are created by machining and can be created by using chemical and electrochemical etching of the wafer handling surfaces of processing hardware pieces.

6 Claims, 6 Drawing Sheets

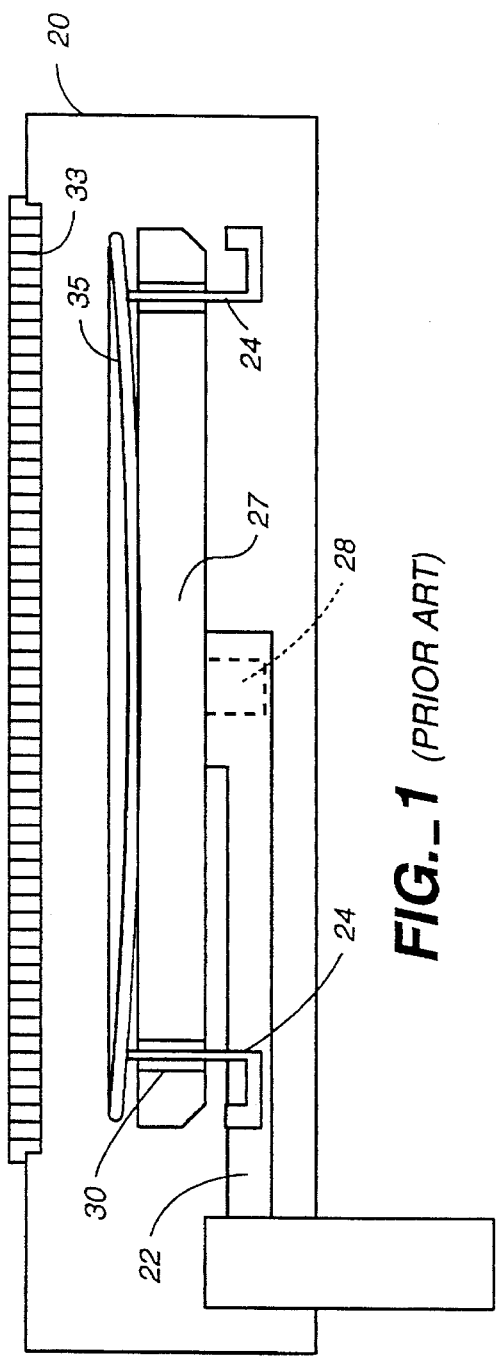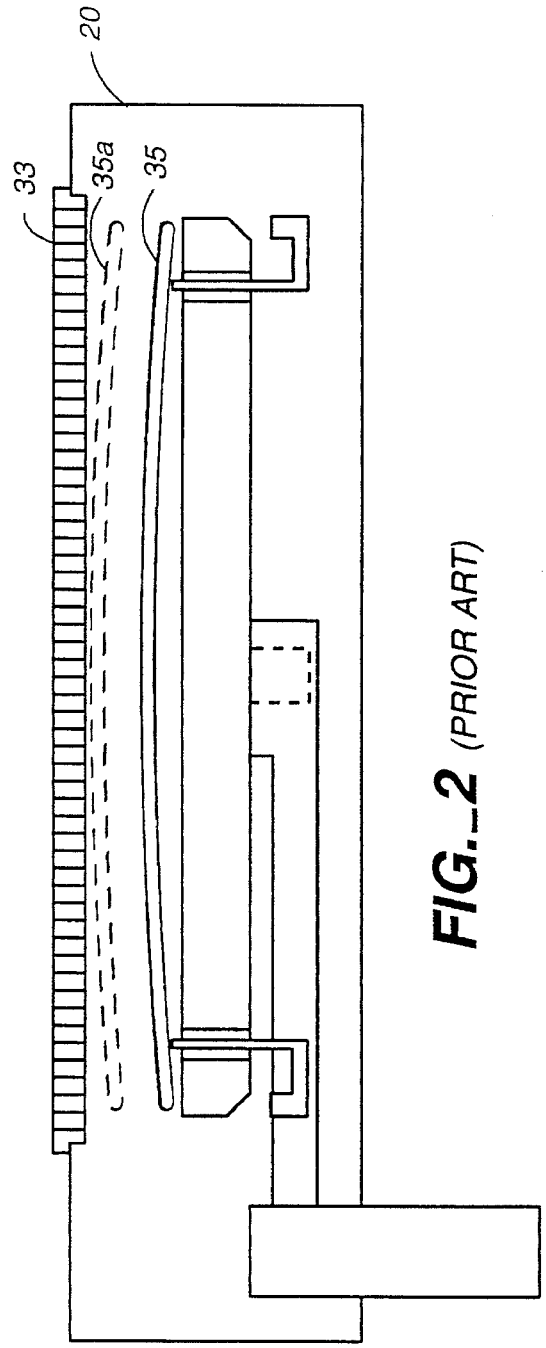

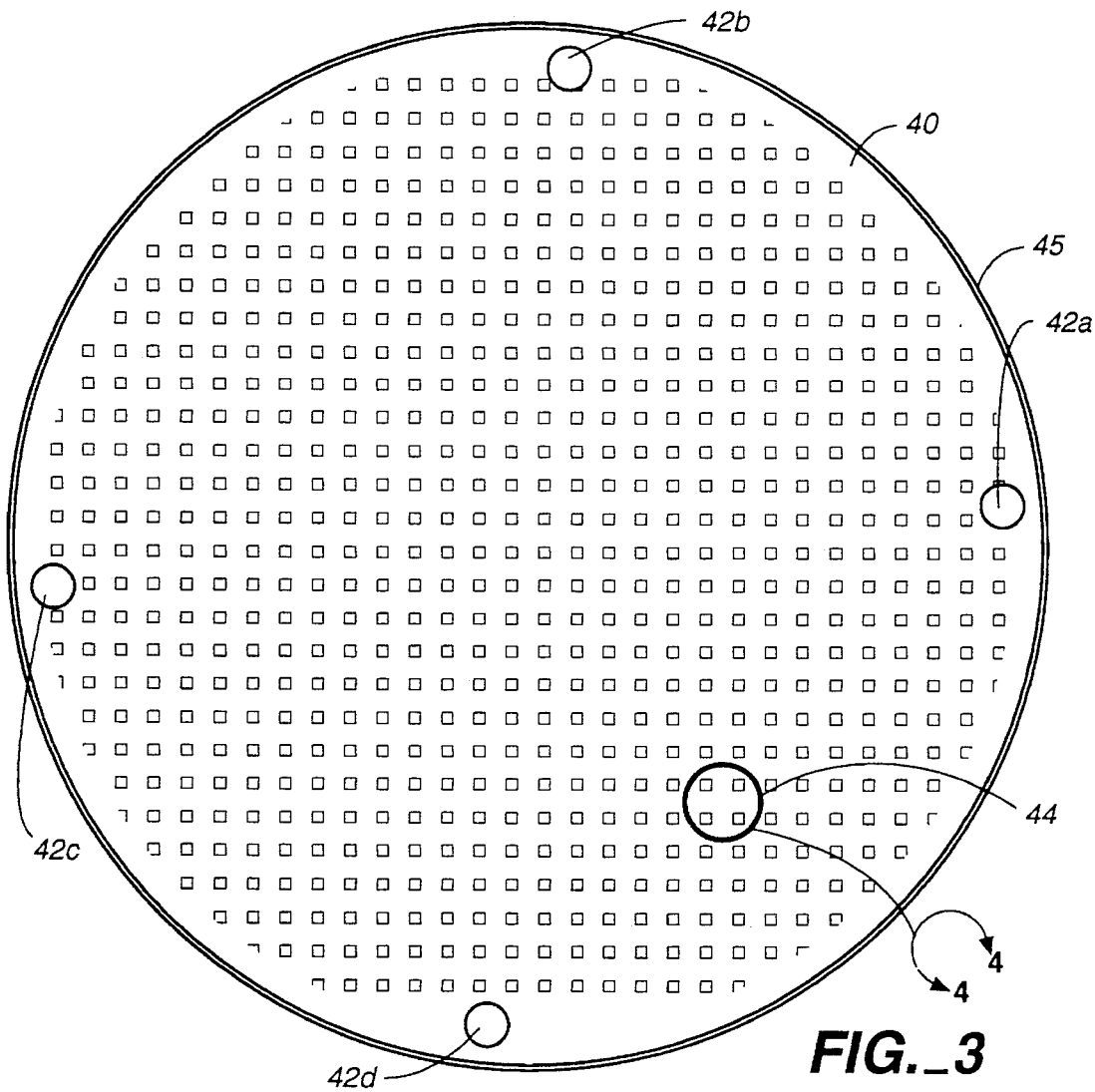
FIG._3
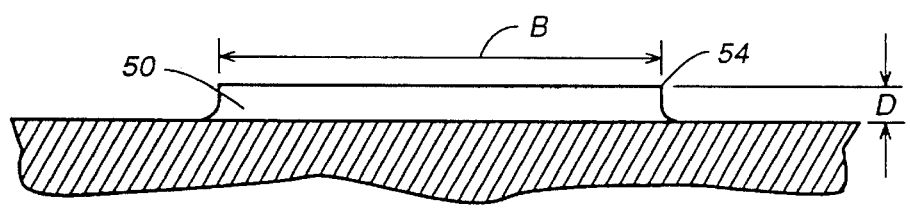
FIG._5
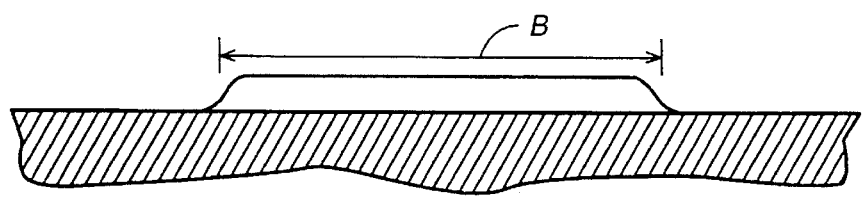
FIG._5A

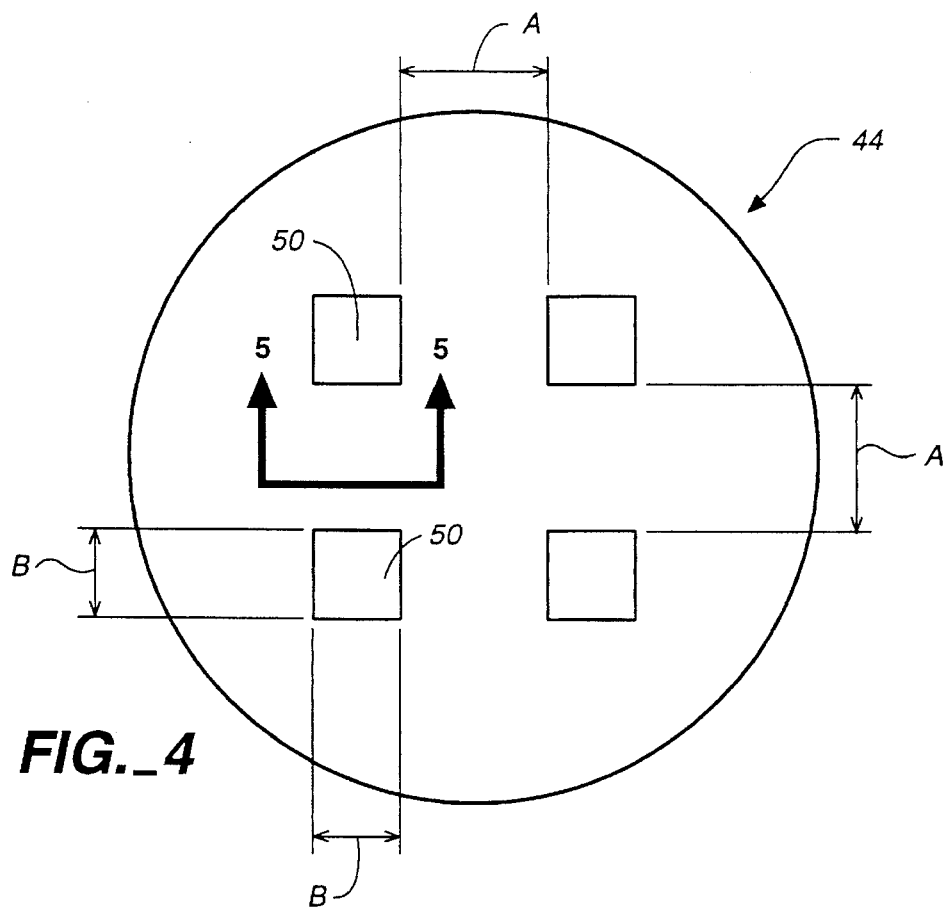
FIG._4
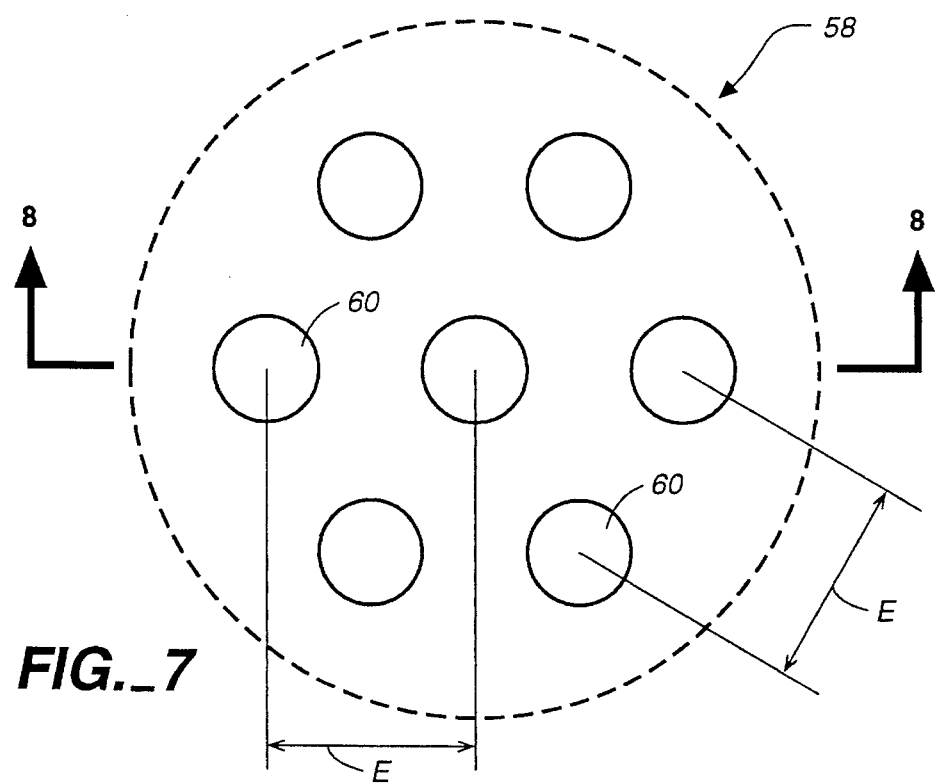
FIG._7

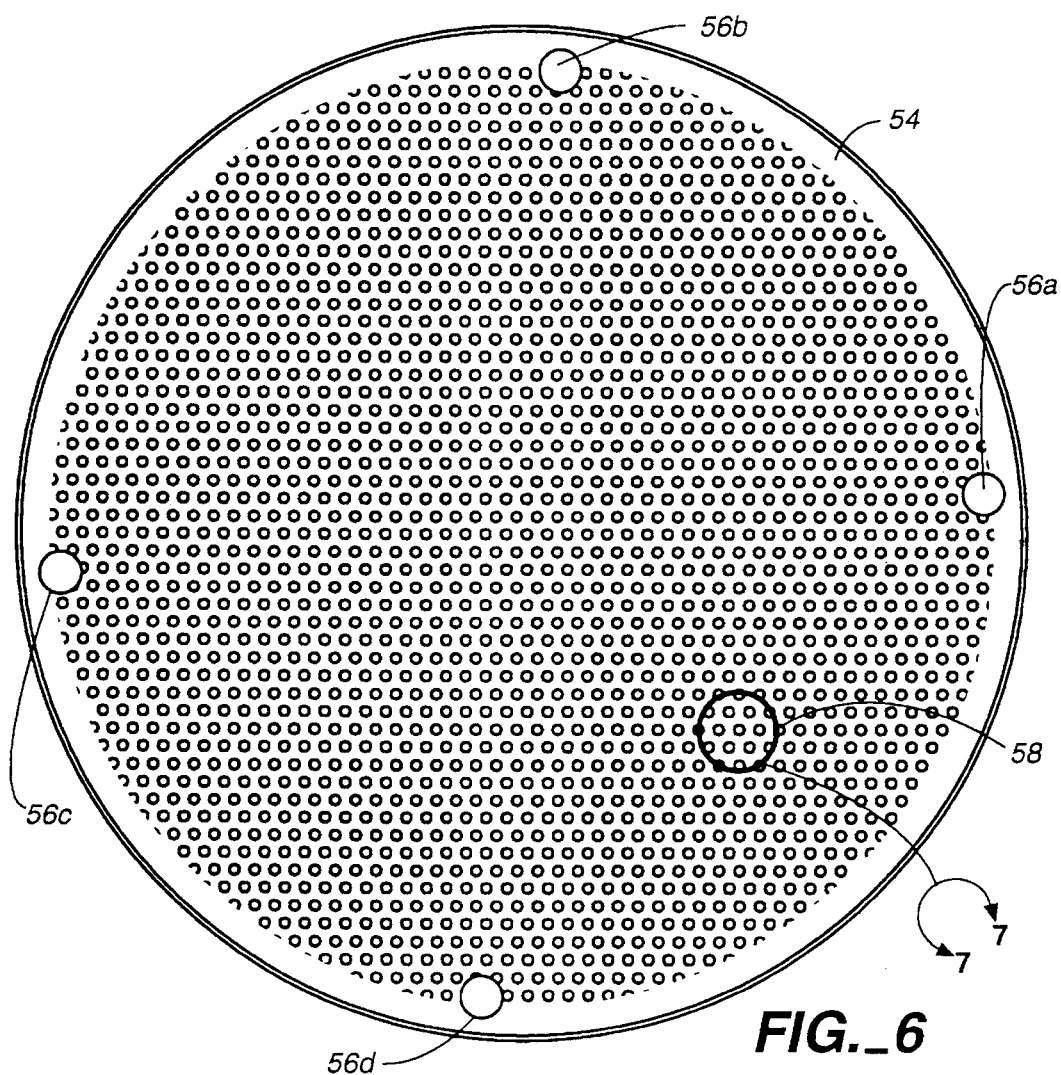
FIG._6
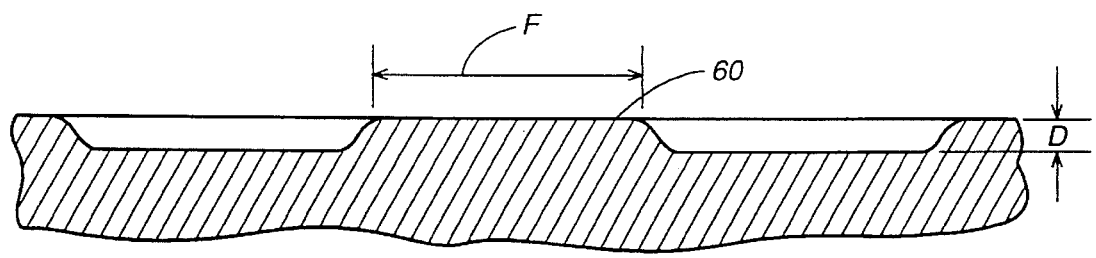
FIG._8

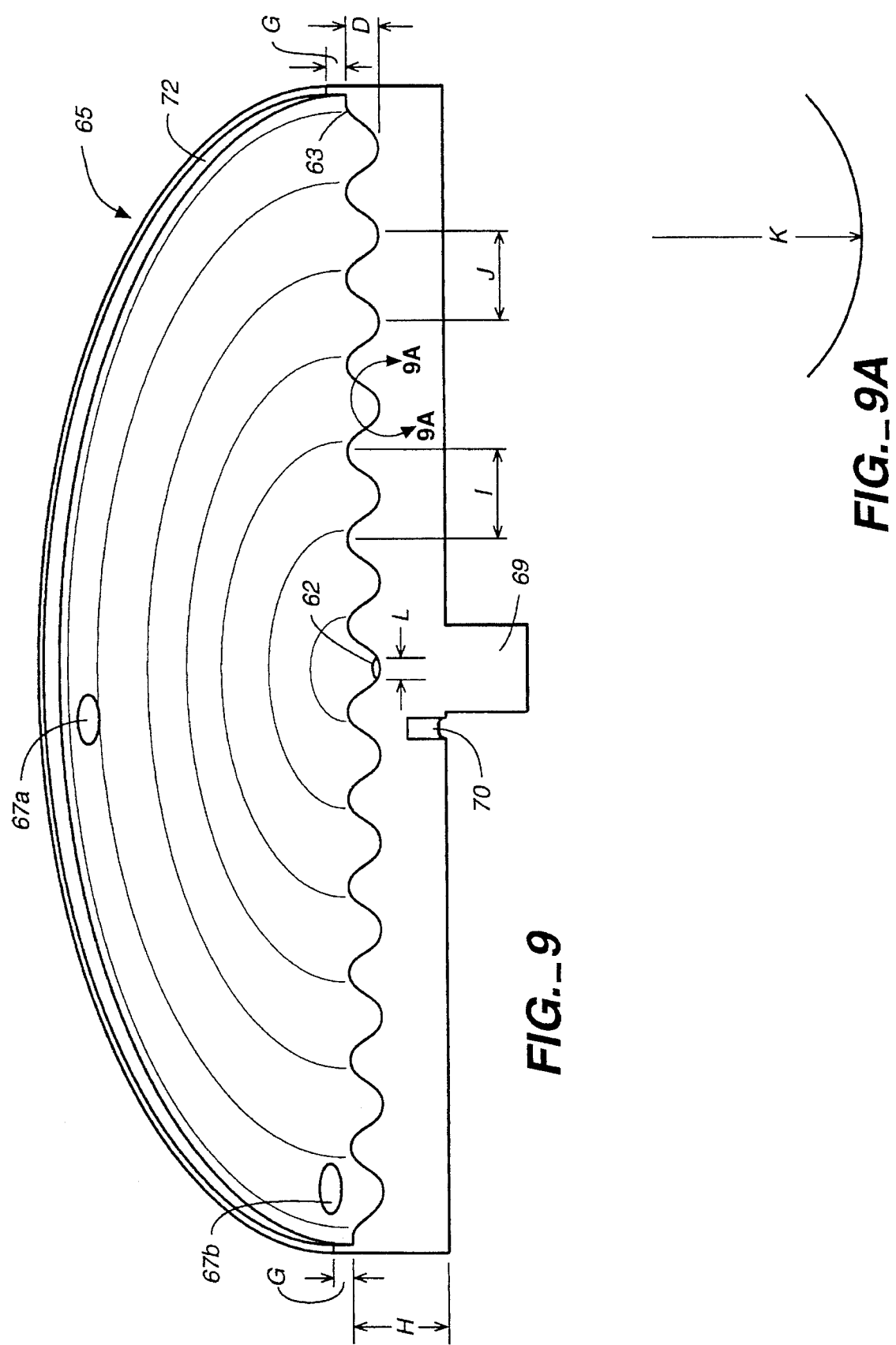

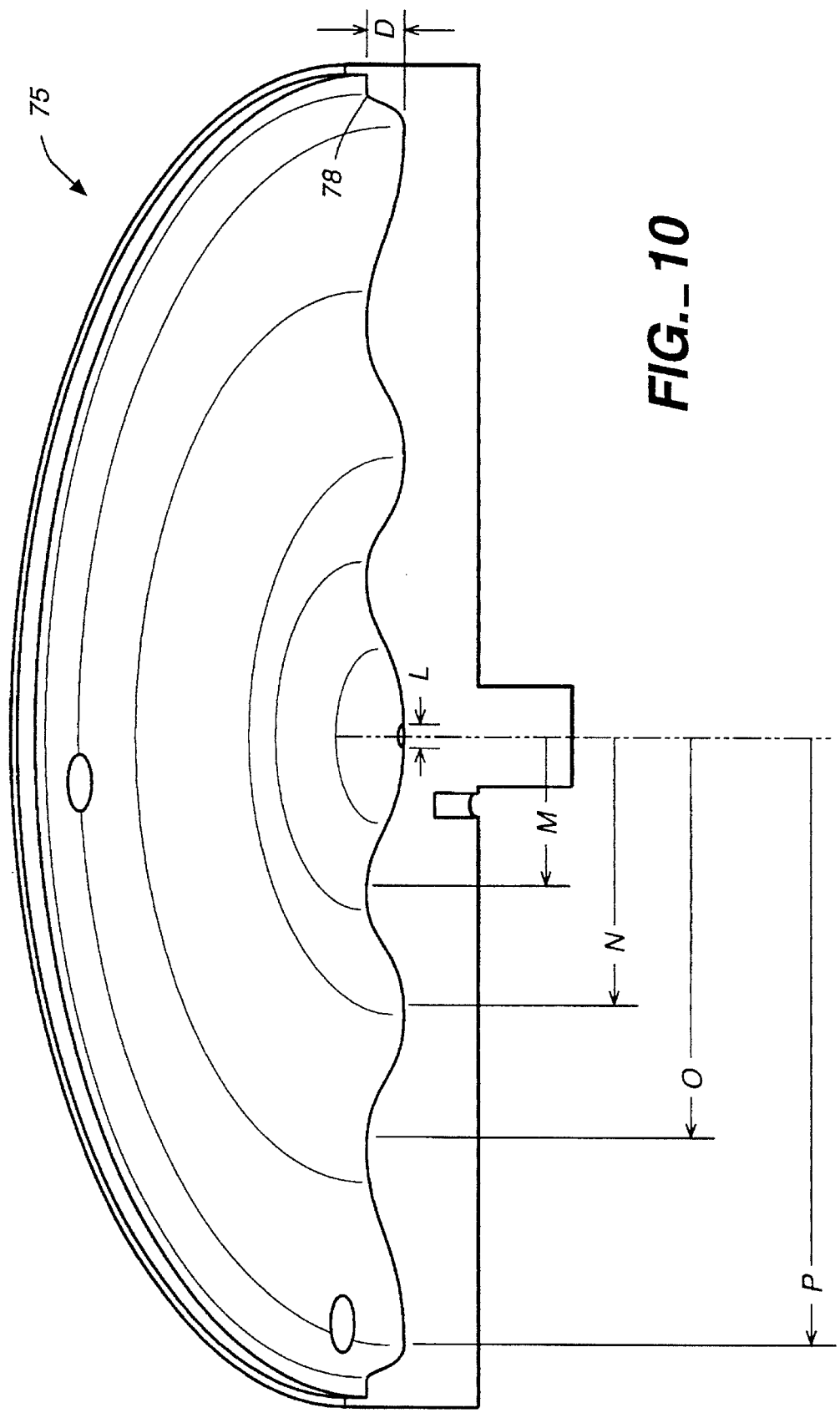
FIG._10

5,531,835

PATTERNED SUSCEPTOR TO REDUCE ELECTROSTATIC FORCE IN A CVD CHAMBER

FIELD OF THE INVENTION

This invention relates to the surface preparation of pedestals or susceptors used to support semiconductor substrates in semiconductor fabrication process chambers.

BACKGROUND OF THE INVENTION

Semiconductor substrates (wafers) are generally flat and, during processing (e.g. etching, vapor deposition), are fully supported on a generally flat surface of a pedestal or susceptor. During processing, the wafer is exposed to elevated temperatures and magnetic and electrical fields. A typical processing chamber 20 is shown in FIG. 1. A gas distribution plate 33 directs gas toward a wafer 35 supported by an anodized aluminum susceptor 27. The gas distribution plate 33 is supplied with alternating RF current which causes the gas to form a plasma. The susceptor 27 is grounded to aid in the deposition process and stabilize the plasma envelope.

The electrical fields can cause an electrostatic charge to form on the wafer. The charge on the wafer attracts an opposite charge in the conductive metal susceptor to create an electrostatic attraction between the wafer and the susceptor which results in a sticking force preventing the wafer and susceptor from separating. This sticking force can and does cause problems when the wafer is being handled and transferred into and out of a wafer processing chamber.

The small gap between the wafer and the flat susceptor, and the insulating properties of the surface of the susceptor material, e.g., the anodized material at the surface of an anodized aluminum susceptor, constitute a dielectric layer between the wafer and the susceptor. This dielectric layer causes the susceptor and wafer to a act as two plates of a capacitor. The sticking force between the wafer and susceptor can therefore be modeled by capacitor principles.

The electrostatic attractive force (sticking force) between the wafer and susceptor is directly proportional to the dielectric constant of the anodization coating and is inversely proportional to the square of the distance between the surfaces of the two pieces, i.e., the thickness of the anodization coating on the pedestal.

This sticking problem is illustrated in FIGS. 1 and 2. A semiconductor wafer 35 is shown in a semiconductor processing chamber 20. A plurality of lift fingers 24 (usually four) are situated to pass through lift pin holes 30 near the perimeter of the susceptor 27. The lift fingers raise the wafer above the pedestal when processing of the wafer is completed and the wafer is to be removed from the chamber by a robot (not shown).

Specifically, relative motion between the lift fingers and the susceptor (the lift fingers rising and/or the susceptor descending) causes the lift fingers 24 to come in contact with a bottom side of the wafer 35 and exert a force on the bottom of the wafer to start to lift the wafer 35 from the susceptor 27. The electrostatic sticking force attracting the wafer 35 to the susceptor 27 must be overcome to lift the wafer clear of the surface of the susceptor. The electrostatic attraction force between the wafer and the pedestal can hold the center of the wafer against the pedestal while the lift fingers begin lifting the perimeter of the wafer. This flexes the wafer into a concave shape (bowl shape) as shown in FIG. 1. As the lift fingers continue to rise through the susceptor, the force the lift fingers exert on the wafer continues to rise and continues to increase the flexing of the wafer until the sticking force holding the wafer 35 to the susceptor 27 is overcome. The release of the sticking force is unpredictable and is often sudden.

The release is unpredictable because the sticking force is dependent on the spacing and relative positioning between the wafer and the susceptor. Each susceptor and each wafer are made as uniformly as possible, but manufacturing tolerances introduce small variations which unpredictably alter the sticking force. The adhesion can be lopsided or otherwise non-uniform resulting in a non-uniform flexing and unpredictable release of the wafer from the susceptor.

When the release of the wafer from the susceptor is gradual and smooth, the lift pins when raising the wafer from the susceptor will initially contact the wafer at lift locations on the underside of the wafer, and will maintain contact with those same lift locations throughout the lifting cycle of the lift fingers.

When the release is sudden, the flexing of the wafer causes the lift fingers to flex or change their support location on the bottom of the wafer. Because the release is sudden, the restoring momentum of the mass at the center of the previously bowl shaped wafer will cause the wafer to unweight from the lift fingers, as the wafer 35 shown in FIG. 2. In extreme cases the momentum will be sufficient to launch the wafer off the lift fingers (as pictured in FIG. 2 by the dashed lines 35a, depicting such a launching). The wafer after reaching the peak of its travel will return to again be supported by the lift fingers. The unweighting or launching of the wafer is not generally uniform and can and does cause oscillation and sliding or relative movement between the wafer and the lift fingers.

In these scenarios, the initial points of lift finger contact on the bottom of the wafer are not maintained when the wafer is suddenly released from the susceptor. The movement of the wafer relative to the ends of the lift fingers causes the initial alignment and registration of the wafer to be altered. This alteration must be recognized and corrected before future detailed processing steps can take place. In some instances the displacement of the wafer from its original position on the lift fingers is so great that the wafer can no longer be handled by the normal wafer handling robot blade, and normal processing must be interrupted until the displaced wafer's position can be corrected so that further processing and/or handling can continue.

The regular displacement of wafers from their registered positions during processing is a big problem in semiconductor processing. It creates delays in production and can ruin whole wafers when left uncorrected in subsequent processing steps.

SUMMARY OF THE INVENTION

In our invention, raised features on the wafer support pedestal increase the average spacing between the semiconductor wafer and the pedestal and/or decrease the average dielectric constant of the region between the wafer and the pedestal so as to decrease the electrostatic attractive force (sticking force) between the wafer and the pedestal. This is opposite the principle behind an electrostatic type chuck which minimizes such spacing to provide maximum sticking force between the workpiece and the workpiece holder.

Different embodiments of specific repeating patterns of raised features are disclosed. Each pattern reduces pedestal surface area directly in contact with the wafer.

In one embodiment, a dimple pattern rises from the surface of a depression in the surface of the susceptor. The dimples can be formed by micro machining, chemical milling, bead blasting, photoetching, electropolishing, and by other related chemical/electrochemical techniques which can selectively remove material to leave a dimpled pattern.

In another embodiment the high and low regions consist of circularly patterned waves, which appear to emanate from the center of the susceptor, similar to the wave pattern observed when a rock is dropped into a still pond. The crests of the waves create an imaginary plane on which the wafer can be supported. The troughs of the waves act similarly to the depression in the dimpled pattern, by separating the surface of the wafer from the surface of the susceptor, thereby increasing the average spacing between the susceptor and the wafer a wave pattern can easily be introduced into the surface of a susceptor piece by turning the piece on a lathe.

Our invention greatly reduces or eliminates the problems of sticking, launching, and the resulting de-registration of wafers as they are being moved from their processing position in prior art configurations.

BRIEF DESCRIPTION OF THE DRAWINGS

FIG. 1, shows a cross section of a processing chamber showing a wafer in the process of being lifted off a susceptor, as performed in the prior art;

FIG. 2, shows a progression of the lifting of the wafer from the configuration of FIG. 1, where the wafer has been released from the susceptor;

FIG. 3 shows a plan view of a square pattern dimpled susceptor according to the invention;

FIG. 4 shows a close-up of the square dimpled pattern of FIG. 3 taken at 4—4;

FIG. 5 shows a side view of a square dimple of FIG. 4 taken at 5—5 just after machining;

FIG. 5A shows the square dimple of FIG. 5 after processing to radius sharp corners;

FIG. 6 shows a plan view of a hexagonal pattern dimpled susceptor according to the invention;

FIG. 7 shows a close-up of the hexagonal dimpled pattern of FIG. 6 taken at 7—7;

FIG. 8 shows a cross section of the hexagonal dimpled pattern of FIG. 6 taken at 7—7;

FIG. 9 is a cross section of a susceptor according to the invention, showing a greatly exaggerated surface pattern of waves with 7 crests appearing to emanate from the center of the susceptor;

FIG. 9A is a close up view of a trough radius of a wave of FIG. 9 taken at 9A—9A; and FIG. 10 is a cross section of a susceptor according to the invention, showing a greatly exaggerated surface pattern of waves with 3 crests appearing to emanate from the center of the susceptor.

DETAILED DESCRIPTION OF PREFERRED EMBODIMENTS

A pattern of high and low regions on the surface of a susceptor 40 increases the average spacing between the semiconductor wafer 35 and the electrically conductive body of the wafer support pedestal 27. Alternatively, such a pattern in the outer dielectric layer (such as the anodization layer of an anodized aluminum pedestal) reduces the average dielectric constant of the region between the wafer 35 and the conductive metal (e.g., aluminum) body of the pedestal underlying the dielectric layer. The tops of the high regions are coplanar and support the wafer.

The surface area of the high region in contact with the wafer is substantially less than the surface area of the wafer or the susceptor. The percentage of high region area to the surface area of the susceptor facing the wafer is reduced from substantially 100% in the prior art, to substantially less than 50%, and in certain configurations as little as 2%.

Uniform heating of the substrate needs to be maintained. To facilitate uniform heating and prevent overheating of the wafer there must be enough contact between the substrate (wafer) support and the wafer to allow thermal energy to flow from the wafer to its support to reduce temperature gradients in the wafer and reduce the likelihood of fracture due to excessive thermal gradients.

Too little contact area will prevent effective thermal heat transfer from occurring to dissipate the energy input to the wafer. The temperature of the wafer will then rise, and subject the wafer to differential thermally induced stress, which can crack the wafer. Conversely, if too large an area is in contact with and in close proximity to the wafer, then electrostatic sticking forces will not be substantially reduced and the aforementioned difficulties associated with wafers sticking will occur.

The electrostatic attraction force between the wafer and the pedestal is:

$$F = \frac{V^2 \cdot \epsilon_0 \cdot k \cdot A}{2x^2} \qquad \text{(Eq. 1)}$$

Where

F=force of attraction

V=voltage $\epsilon_0$=permittivity of free space k=dielectric constant

A=area

X=separation distance (or average/effective separation distance).

Since the electrostatic force associated with sticking is inversely proportional to the square of the distance (X) between the two charged surfaces, increasing the gap between the wafer and susceptor from a nominal 0.001" to 0.0025" (2.5 times) will decrease the effective attraction by approximately 6 times, while increasing the separation from 0.001 in. to 0.004 in. will reduce the force 16 times.

Alternatively, and more preferably, instead of increasing the gap between the wafer and conductive metal body of the pedestal, the average dielectric of the region between them can be decreased by removing portions of the dielectric coating on the pedestal. The average dielectric constant decreases because the dielectric constant of the pedestal's dielectric coating (e.g., aluminum oxide in the case of an anodized aluminum pedestal) is much greater than the dielectric of the gas or vacuum which occupies the spaces created by regions from which dielectric has been removed.

The following embodiments of patterned susceptors have been found to satisfy process requirements and avoid the problem of wafer sticking due to electrostatic charge.

FIG. 3 shows a square dimpled pattern susceptor 40. A close up of the dimples 50 and the dimpled pattern 44 is shown in FIGS. 4, 5, and 5A. The square dimples are machined in a an aluminum (preferably 6061-T6 cold drawn) susceptor. The dimple's nominal length and width "B" is approximately 1/16 of an inch (0.063" or 1.59 mm).

The distance "A" between dimples arranged in a square pattern as shown in FIG. 4 is approximately 3/16 of an inch (0.188" or 4.76 mm). When pattern is machined into the surface of the susceptor 40, a side view of each dimple 50, as shown in FIG. 5, is observed. The dimple dimensions "B" after machining result in sharp corners 54 at the top edges of the dimples 50. Since sharp corners increase the likelihood that electrical charges built up in the capacitor plates will prematurely discharge (spark) at the sharp corners, sharp corners need to be avoided. Therefore the machined piece is fully annealed and then blasted with abrasive aluminum oxide and then anodized with sulfuric acid to achieve a surface finish of Ra=40 to 60 after anodization. The square top dimpled plateau of FIG. 5 after the above described finishing process becomes the dimple with radiused edges as shown in FIG. 5A. Note that radiusing of the top corners effectively reduces the actual dimensions of the dimple's top surface as can be seen by comparing the dimension "B" between FIGS. 5 and 5A. The rounded corners of the dimples achieved by this finishing, reduces and nearly eliminates the likelihood of premature spark discharge from the surface of the susceptor to the wafer.

The area around the dimples is machined to a depth "D" of approximately 0.0025" (0.064 mm) within a tolerance of 0.0005" (0.013 mm).

The surface patterns can also be achieved by using selective abrasive blasting, chemical polishing, electropolishing, or a combination these. Patterns can also be introduced by knurling and by stamping.

This square pattern 44 covers the entire surface of the apart from lift pin holes 42a,b,c,d and the edge flange or ledge 45. The lift pin holes (approx. 0.313" or 7.95 mm in diameter) are spaced symmetrically from a datum, and to match the location of the lift fingers underneath.

The edge flange 45 extends approximately 0.030" (0.76 mm) above the surface of the dimples 50 and creates a perimeter flange approximately 0.055" (1.4 mm) thick. The inside surface of the flange is beveled at approximately 30° which potentially assists in guiding displaced wafers to the susceptor surface. The flange 45 has a inner diameter of 7.934" or 201.5 mm. The corners of the flange are radiused during abrasive blasting and anodizing of the susceptor piece. A susceptor hub (not shown) centered on the back side of the susceptor connects the susceptor to its support arm and electrical ground. The susceptor ground connection is routed through the hub 28 of the susceptor 27 and the susceptor support arm 22 to the grounded wall of the chamber of the type shown in FIG. 1.

A hexagon dimple patterned susceptor 54 is shown in FIGS. 6, 7, and 8. The materials and processing are similar to that described for the square pattern dimpled susceptor. However, the hex dimple pattern is not produced by machining, but is produced by photoetching a pattern in the surface of the susceptor which leaves a series of circular dimples 60 protruding from the surface 54 of the susceptor. The dimples form a true hexagonal pattern with the spacing between the centers of adjacent dimples (dimension "E") being equal. The dimple 60 nominal diameter is designated as dimension "F" on FIG. 8, and the dimple has a height "D".

In the configuration shown in FIGS. 6, 7, and 8, the dimension "E" is 0.060" (1.52 mm), the dimension "F" is 0.030" (0.76 mm), and the dimension "D" is 0.0025" (0.06 mm). The hex dimple patterned susceptor has lift finger holes 56a,b,c,d similar to those shown for the square dimple patterned susceptor discussed above. Similarly, the hex dimple pattern susceptor 54 has an edge flange identical to the edge flange described for the square dimpled pattern susceptor described above.

Another hex dimpled pattern configuration similar to those shown in FIGS. 6, 7, and 8, but with different dimensions can be utilized. In this other configuration the dimension "E" is 0.050" (1.27 mm), the dimension "F" is 0.010" (0.25 mm), and the dimension "D" is 0.0025" (0.06 mm). The hex dimple patterned susceptor has lift finger holes similar to those shown for the square dimple patterned susceptor discussed above. Similarly, this hex dimple pattern susceptor has an edge flange identical to the edge flange described for the square dimpled pattern susceptor described above. If FIG. 8 were to be revised to show this other configuration more to scale, the whole outline of individual dimples would be seen though the opening between dimples.

Another pattern used to reduce the electrostatic sticking force is shown in FIG. 9. FIG. 9 presents a cross section of circular wave pattern appearing to emanate from the center of the susceptor. The size of the waves are tremendously exaggerated compared to their actual scale. The susceptor is approximately 0.233" (5.92 mm) thick ("H") while the amplitude of the waves from trough to crest "D" are only 0.0025" (0.06 mm), a ratio of approximately 90 to 1, this is in contrast to the false image of a 3 to 1 ratio shown in FIG. 9.

A susceptor 65 for processing a 200 mm wafer is shown. The diameter of the susceptor is approximately 8.053" (204.55 mm). The susceptor is approximately 0.233" (5.92 mm) thick ("H"), with an edge flange 72 extending approximately 0.040" (1.02 mm) ("G") from the face of the susceptor. The inside diameter of the edge flange 72 is approximately 7.936" (201.57 mm) with a 15° bevel on its inner face (bevel not shown in FIG. 9). The crests of the waves align with an imaginary plane on which a wafer can rest. In this configuration the distance between troughs "I" and the distance between crests "J" are both generally uniform about 0.59" (15 mm). The radius of the crests and troughs are also generally uniform as represented by dimension "K" shown in FIG. 9A. This "K" dimension is approximately 8.703" (221.06 mm). Running such radiuses smoothly transitioning one into the does not yield a trough bottom to wave crest dimension equal to one-half the crest to crest ("K") dimension, so a smooth continuous variation in slope provides the transition. The perimeter crest 63 terminates at a diameter of about 7.813" (198.45 mm), while the trough closest to the center of the susceptor terminates at a diameter of 0.143" (3.63 mm) (dimension "L" in FIG. 9).

The susceptor 65 includes four lift finger holes, only two (67a,b) of which are shown in FIG. 9. These holes are similar to the lift finger holes described above.

The susceptor 65 includes a centrally located hub 69 on its back side. The hub 69 is cylindrical shaped (with a diameter of approximately 0.700"), but has a flat on one side (the left side of the hub when viewing FIG. 9). The flat on the hub assists in hub alignment and helps to located and secure a thermocouple on the back of the susceptor. A thermocouple hole (well) 70 is located in the back of the susceptor 65 to permit monitoring of the susceptor temperature during processing. The thermocouple well 70 has a depth of approximately 0.15" (3.81) and is drilled to receive the diameter of a thermocouple, and it may be threaded to retain a similarly threaded thermocouple end.

FIG. 10 shows an alternate embodiment of a wave patterned susceptor face. The susceptor 75 has 3 wave crests rather than the 7 shown in FIG. 9. The depth "D" of the waves is 0.0025" (0.06 mm). Again, as in FIG. 9, the vertical proportions of the waves are exaggerated. The outermost crest 78 terminates at a radius of 8.7033" (221.06 mm). The first trough adjacent to the perimeter bottoms at a diameter of 7.223" (183.46) ("P"). The radius of the wave approaching this trough from the perimeter is 8.7033" (221.06 mm) until the bottom of the trough is reached. From the bottom of this trough "P" inward the radius of the wave shape changes to have a radius of 153.53" (3899.66 mm) until the intermediate crest "O" is reached. The intermediate crest is located at a diameter of 4.745" (120.52 mm) ("O"). The radius of the wave shape, now concave down, changes at the top of the crest "O" to have a radius of 58.833" (1494.36 mm). This concave down surface transitions into a concave up surface at a middle trough "N" having a bottom diameter of 3.211" (81.56 mm). The concave up wave shape continues toward the center of the susceptor maintaining the 58.833" (1494.36 mm) radius. This wave form transitions into a concave down shape at an inner crest "M" located at diameter of 1.677" (42.60 mm). The wave radius continues and transitions to terminate at the bottom of a trough at a diameter "L" 0.143" (3.63 mm) from the center of the susceptor. The crests of the waves form an imaginary flat plate on which the wafer can rest. The details of the perimeter flange, lift pin holes, hub, and thermocouple receiving hole are as described above for FIG. 9.

This structure also defines a method of reducing the sticking force by recognizing the parameters used in Eq. 1 and whose interrelationship is defined by Eq. 1. A reduction in the sticking force is achieved by adjusting one or more of the parameters as therein defined to cause a force (F) to be reduced.

While the invention has been described with regards to specific embodiments, those skilled in the art will recognize that changes can be made in form and detail without departing from the spirit and scope of the invention.

We claim:

1. A plasma enhanced chemical vapor deposition substrate processing chamber comprising:

a gas distribution plate through which a process gas is directed into the processing chamber;

a susceptor located opposite said gas distribution plate;

wherein said susceptor is electrically grounded and said gas distribution plate is charged to create a plasma between said distribution plate and said susceptor, wherein when a substrate is disposed on said susceptor said substrate becomes coated with a product of gas constituent reactants;

wherein said susceptor includes a wafer supporting surface having a pattern of high regions above a low region, said high regions defining a reference plane on which said wafer can be supported above and separated from said low region wherein said high regions include the crests of waves in a circular pattern appearing to emanate from a center point.

2. A plasma enhanced chemical vapor deposition substrate processing chamber as in claim 1, wherein said pattern is repeating at least once.

3. An apparatus as in claim 1 wherein said pattern is produced on said surface by chemical milling.

4. An apparatus as in claim 1, wherein said pattern is produced on said surface by photoetching.

5. An apparatus as in claim 1, wherein said high regions forming a reference plane above said low regions generally contact the substrate supported thereon with a contact area of less than 50% of the total substrate area.

6. An apparatus as in claim 5, wherein said contact area is less than 30% of said total contact area.

* * * * *